US012782388B2

(12) United States Patent
Su et al.

(10) Patent No.: US 12,782,388 B2
(45) Date of Patent: Nov. 3, 2026

(54) CONTACT PROBE AND CONTACTING MEMBER THEREOF, METHOD OF MANUFACTURING CONTACTING MEMBER, PROBE SYSTEM USING THE CONTACTING MEMBER, METHOD OF TESTING UNPACKAGED SEMICONDUCTOR DEVICE, TESTED SEMICONDUCTOR DEVICE AND METHOD OF PRODUCING THE SAME

(71) Applicant: MPI CORPORATION, Chu-Pei City (TW)

(72) Inventors: Cheng-Nien Su, Chu-Pei City (TW); Chung-Chi Lin, Chu-Pei City (TW); Ching-Hua Wu, Chu-Pei City (TW); Hsien-Ta Hsu, Chu-Pei City (TW)

(73) Assignee: MPI CORPORATION, Chu-Pei City (TW)

( * ) Notice: Subject to any disclaimer, the term of this patent is extended or adjusted under 35 U.S.C. 154(b) by 194 days.

(21) Appl. No.: 18/771,127

(22) Filed: Jul. 12, 2024

(65) Prior Publication Data

US 2025/0035671 A1 Jan. 30, 2025

Related U.S. Application Data

(60) Provisional application No. 63/529,368, filed on Jul. 28, 2023.

(51) Int. Cl.
*G01R 1/067* (2006.01)
*A47J 37/12* (2006.01)
(Continued)

(52) U.S. Cl.
CPC ..... *G01R 1/06738* (2013.01); *G01R 1/06727* (2013.01); *G01R 1/06733* (2013.01);
(Continued)

(58) Field of Classification Search
CPC ............ G01R 1/06738; G01R 1/06772; G01R 3/00; G01R 31/2886; G01R 1/06727; G01R 1/06733; A47J 37/1223; A47J 37/1271
(Continued)

(56) References Cited

U.S. PATENT DOCUMENTS

2002/0153910 A1* 10/2002 Felici ................. G01R 1/06716 324/755.06
2008/0042673 A1* 2/2008 Hayden .............. G01R 1/06766 324/754.11
(Continued)

FOREIGN PATENT DOCUMENTS

CN 107894521 A 4/2018
JP 52-95182 A 8/1977
(Continued)

*Primary Examiner* — Raul J Rios Russo
(74) *Attorney, Agent, or Firm* — Birch, Stewart, Kolasch & Birch, LLP

(57) ABSTRACT

A contacting member of a contact probe for a probe system for performing a functionality test to a DUT includes a body, a contact tip, and a tip transition section between the body and the contact tip. A bottom side of the contacting member, which faces toward the DUT when testing the DUT, includes a lower surface at the body, a tip bottom surface at the contact tip, and a tip transition surface at the tip transition section. A contact end of the contact tip for contacting the DUT is located on a front side of the tip bottom surface. A rear side of the tip bottom surface and the lower surface have a height difference therebetween. The tip transition surface gradually changes in height from the lower surface to the rear side of the tip bottom surface. The contacting member has high precision and structural strength.

20 Claims, 10 Drawing Sheets

(51) Int. Cl.
*G01R 3/00* (2006.01)
*G01R 31/28* (2006.01)

(52) U.S. Cl.
CPC ........... *G01R 1/06772* (2013.01); *G01R 3/00* (2013.01); *G01R 31/2886* (2013.01); *A47J 37/1223* (2013.01); *A47J 37/1271* (2013.01)

(58) Field of Classification Search
USPC ...................................................... 324/754.03
See application file for complete search history.

(56) References Cited

U.S. PATENT DOCUMENTS

| | | | | |
|---|---|---|---|---|
| 2010/0259290 | A1 | 10/2010 | Liu | |
| 2012/0032697 | A1 | 2/2012 | Khoo et al. | |
| 2017/0122980 | A1* | 5/2017 | Crippa ............... | G01R 1/07307 |
| 2017/0307657 | A1* | 10/2017 | Crippa ............... | G01R 1/06716 |
| 2018/0095111 | A1 | 4/2018 | Tsai et al. | |
| 2022/0390489 | A1 | 12/2022 | Narita et al. | |
| 2023/0288447 | A1* | 9/2023 | Felici ................. | G01R 1/06761 |
| 2024/0044940 | A1* | 2/2024 | Crippa ............... | G01R 1/06733 |

FOREIGN PATENT DOCUMENTS

| | | | |
|---|---|---|---|
| JP | 10-90303 | A | 4/1998 |
| JP | 2003-139799 | A | 5/2003 |
| JP | 2005-257693 | A | 9/2005 |
| JP | 2009-236724 | A | 10/2009 |
| KR | 10-0494618 | B1 | 6/2005 |
| KR | 10-0876077 | B1 | 12/2008 |
| TW | 200602644 | A | 1/2006 |
| TW | 201202710 | A1 | 1/2012 |
| TW | 201814301 | A | 4/2018 |
| WO | 2009/099183 | A1 | 8/2009 |

* cited by examiner

CONTACT PROBE AND CONTACTING MEMBER THEREOF, METHOD OF MANUFACTURING CONTACTING MEMBER, PROBE SYSTEM USING THE CONTACTING MEMBER, METHOD OF TESTING UNPACKAGED SEMICONDUCTOR DEVICE, TESTED SEMICONDUCTOR DEVICE AND METHOD OF PRODUCING THE SAME

CROSS REFERENCE TO RELATED APPLICATIONS

This non-provisional application claims the benefit under 35 U.S.C. § 119(e) to U.S. Provisional Application No. 63/529,368, filed on Jul. 28, 2023, which is hereby expressly incorporated by reference into the present application.

BACKGROUND OF THE INVENTION

1. Field of the Invention

The present invention relates generally to contact probes for testing electronic components and more particularly, to a contact probe having a three-dimensional tip (also referred to as "3D tip" hereinafter), a contacting member of the contact probe, a method of manufacturing the contacting member, a probe system using the contacting member, a method of testing an unpackaged semiconductor device, a tested semiconductor device, and a method of producing the tested semiconductor device.

2. Description of the Related Art

Current methods of manufacturing contact probes having 3D tips involve forming contacting members of the contact probe by using microelectromechanical systems (hereinafter also referred to as "MEMS") technology to create a 3D tip structure, or bending a flat contacting member to form a 3D tip structure. The contacting members manufactured by these methods have limitations in terms of precision and structural strength.

Specifically speaking, the MEMS-formed contacting member is made by stacking multiple layers of material on top of each other. In particular, the contact tip of the contacting member is directly formed in this manner. However, the precision of the tip (i.e. contact tip) can be problematic because the stacking process makes it difficult to achieve precise alignment between the layers. More specifically speaking, each layer needs to be precisely aligned to the previous one to ensure the final structure is accurately formed. Any misalignment can lead to a decrease in precision. However, it is difficult for the stacking process of the MEMS manufacturing process to achieve precise alignment between the layers, resulting in low precision of the final product.

In another aspect, the manufacturing method which involves bending the flat contacting member to form the 3D tip structure will form obvious creases or bending lines (joint lines or tiny gaps) at the bent portion, which causes stress concentration in the material and weakens the structural integrity of the contacting member, leading to low structural strength of the contacting member and a resulting shorter lifespan thereof.

SUMMARY OF THE INVENTION

The present invention has been accomplished in view of the above-noted circumstances. It is an objective of the present invention to provide a contacting member of a contact probe, which can be manufactured without involving MEMS technology or bending the contacting member, so that the contacting member has high precision, high structural strength and the resulting longer lifespan.

To attain the above objective, the present invention provides a contacting member of a contact probe for a probe system for performing a functionality test to a device under test (also referred to as "DUT" hereinafter). The contacting member includes a body, a contact tip, and a tip transition section located between the body and the contact tip. The contact tip includes a contact end for contacting the DUT. The contacting member includes a top side and a bottom side. When the contacting member performs the functionality test to the DUT, the bottom side of the contacting member faces toward the DUT. The bottom side of the contacting member includes a lower surface located at the body, a tip bottom surface located at the contact tip, and a tip transition surface located at the tip transition section. The contact end is located on a front side of the tip bottom surface. A rear side of the tip bottom surface and the lower surface have a height difference therebetween. The tip transition surface extends from the lower surface to the rear side of the tip bottom surface in a way of gradually changing in height.

As a result, the bottom side of the contacting member of the present invention, which is the side for facing toward the DUT, has the height difference between the contact tip and the body. Therefore, the contacting member has the so-called 3D tip structure, which allows for better contact of the contact end of the contact tip with the contact pad of the DUT, improving the testing accuracy and reliability. Besides, there is the tip transition section between the contact tip and the body, and the tip transition surface extends from the lower surface to the tip bottom surface in the way of gradually changing in height, which means the tip transition surface is not configured as a vertical surface or other configurations with abrupt turning, but smoothly connects the lower surface and the tip bottom surface having the height difference therebetween. Such contacting member cannot be formed by using MEMS technology to stack multiple layers on top of each other or formed by bending, but is made by other processing manners, thereby prevented from the problems due to the stacking by MEMS technology or the bending, such as low precision, stress concentration, low structural strength and short lifespan. Besides, the above-described smooth tip transition surface can also reduce stress concentration and improve the structural integrity, making the contacting member even more durable and reliable.

Preferably, the contacting member is formed from a substrate having the height difference by a cutting process. In other words, the height difference of the contacting member comes from the substrate's own height difference, not MEMS technology stacking multiple layers on top of each other to form the contacting member having the height difference. Such contacting member is monolithically formed without bending, and only needs the cutting process to define the shape of the contacting member, thereby reducing stress concentration and improving structural integrity. As such, the contacting member has high structural strength and the resulting longer lifespan. The cutting process may be, for example, laser cutting, EDM (electrical discharge machining) cutting, and so on, allowing for high precision in defining the required shape of the contacting member by cutting, especially making the contact end of the contact tip have high positional precision for precise alignment with the contact pad of the DUT, thereby beneficial for the testing.

Preferably, the tip transition surface includes a gradual transition curve and/or an inclined plane.

As a result, the gradual transition curve has a radius of curvature that gradually changes along its length, allowing it to smoothly achieve the height difference without any abrupt change in curvature. The inclined plane can also smoothly achieve the height difference to a certain extent. The gradual transition curve and the inclined plane are both effective in reducing stress concentration and improving the structural integrity, making the contacting member have even higher structural strength. According to different manufacturing process, the tip transition surface may be a gradual transition curve, or the tip transition surface may be an inclined plane, or the tip transition surface may include both of a gradual transition curve and an inclined plane.

Preferably, the surface roughness of the lower surface and the tip transition surface is different from the surface roughness of the tip bottom surface.

As a result, a surface lowering process can be performed on a plane to provide the height difference. For example, in the above-described case that the contacting member is formed from the substrate having the height difference by the cutting process, the substrate can be formed from a flat plate by a surface lowering process, thereby formed with a relatively lower surface and a transition surface with gradually changing height. The surface lowering process may be, for example, chemical etching, laser etching, and so on, making the surface roughness of the relatively lower surface and the transition surface different from the surface roughness of the original flat plate. After the contacting member is formed from the substrate by the cutting process, the lower surface and the tip transition surface of the contacting member are formed from the aforementioned relatively lower surface and transition surface of the substrate respectively. The surface lowing process facilitates manufacture of the substrate having the required height difference and transition surface to make the contacting member formed therefrom have high precision and high structural strength.

Preferably, the body of the contacting member includes a relatively thinner section, a relatively thicker section, and a body transition section located between the relatively thinner section and the relatively thicker section. The lower surface is located at the relatively thinner section. The bottom side of the contacting member further includes a body bottom surface located at the relatively thicker section of the body, and a body transition surface located at the body transition section. The body bottom surface and the lower surface have the height difference therebetween. The body transition surface extends from the lower surface to the body bottom surface in a way of gradually changing in height.

As a result, the body of the contacting member also has its own height difference, and the relatively thinner section thereof is relatively closer to the contact tip, so the contacting member still has the so-called 3D tip structure, which allows for better contact of the contact end of the contact tip with the contact pad of the DUT, improving the testing accuracy and reliability. The body of the contacting member has the relatively thicker section located relatively farther from the contact tip, which improves the structural strength of the body of the contacting member, and beneficial for the body of the contacting member to be fixed to another component for composing the contact probe. Besides, the height difference of the body of the contacting member also comes from the substrate's own height difference. Such contacting member can be manufactured without involving MEMS technology or bending the contacting member, so that the contacting member has high precision, high structural strength and the resulting longer lifespan. Besides, the body has the body transition section between the relatively thinner section and the relatively thicker section, and the body transition surface thereof gradually changes in height, thereby smoothly connecting the lower surface and the body bottom surface having the height difference therebetween, which can reduce stress concentration and improve the structural integrity, making the contacting member even more durable and reliable.

More preferably, the body transition surface includes a gradual transition curve and/or an inclined plane.

As a result, the body transition surface can smoothly achieve the height difference, thereby reducing stress concentration and improving the structural integrity, making the contacting member have even higher structural strength. According to different manufacturing process, the body transition surface may be a gradual transition curve, or the body transition surface may be an inclined plane, or the body transition surface may include both of a gradual transition curve and an inclined plane.

More preferably, the surface roughness of the lower surface, the tip transition surface and the body transition surface is different from the surface roughness of the body bottom surface.

As a result, a surface lowering process can be performed on a plane to provide the height difference between the contact tip and the body and the body's own height difference at the same time. For example, in the above-described case that the contacting member is formed from the substrate having the height difference by the cutting process, the substrate can be still formed from a flat plate by the above-described surface lowering process, thereby formed with a relatively lower surface, and two transition surfaces gradually changing in height and located on two opposite sides of the relatively lower surface respectively, so that the surface roughness of the relatively lower surface and the transition surfaces is different from the surface roughness of the original flat plate. After the contacting member is formed from the substrate by the cutting process, the lower surface, the tip transition surface and the body transition surface of the contacting member are formed from the aforementioned relatively lower surface and transition surfaces of the substrate respectively. The aforesaid surface lowering process facilitates manufacture of the substrate having the required height difference and transition surfaces to make the contacting member formed therefrom have high precision and high structural strength.

Preferably, the contacting member further includes an extending section located between the body and the tip transition section. The body is larger in width than the extending section, the tip transition section and the contact tip. The lower surface is partially located at the extending section.

As a result, the tip transition section is unlimited to direct connection with the body, but the extending section can be further provided therebetween. Besides, the lower surface is partially located at the extending section, which means on the bottom side of the contacting member, the extending section and the body are coplanar with each other. However, the extending section is narrower than the body. Such extending section can provide relatively larger elasticity when the contact tip contacts the contact pad of the DUT, thereby beneficial for the testing.

Preferably, the lower surface is a plane.

As described above, the height difference can be provided by a surface lowering process performed on a plane. The aforementioned relatively lower surface is formed by the surface lowering process. The lower surface of the contacting member is formed from the aforementioned relatively lower surface. Making the relatively lower surface as a plane to make the lower surface of the contacting member as a plane is not only easier in manufacture, but also brings high structural integrity and high structural strength.

Preferably, the top side of the contacting member includes an upper surface located at the body, and a tip top surface located at the contact tip. The tip top surface extends from the upper surface to the contact end inclinedly with respect to the upper surface.

As a result, the top side of the contacting member can be originally a plane, and then formed with the tip top surface by processing such as lapping. For example, in the above-described case that the contacting member is formed from the substrate having the height difference by the cutting process, the top side of the contacting member can be formed from a plane of the substrate. After the shape of the contacting member is defined by the cutting process, the top side of the contacting member can be further formed with the tip top surface by processing such as lapping, so as to sharp the contact tip and provide the contact end at the required position to make the contact end have even higher precision for precise alignment with the contact pad of the DUT, thereby beneficial for the testing.

The present invention also provides a contact probe for a probe system for performing a functionality test to a DUT. The contact probe includes a coaxial cable, and a plurality of above-described contacting members. The coaxial cable includes an inner conductor, an outer conductor, and a dielectric disposed between the inner conductor and the outer conductor. The top side of each contacting member includes an upper surface located at the body. The upper surface of each contacting member is partially fixed to the coaxial cable so that the body of each contacting member extends from where the body is fixed to the coaxial cable and passes over an end of the coaxial cable in a way that each contacting member includes a cantilever section extending from the end of the coaxial cable. The contact tip of each contacting member is located at an end of the cantilever section. The tip bottom surfaces of the contacting members are coplanar with each other. The contacting members include a first contacting member and at least one second contacting member. The upper surface of the first contacting member is fixed to the inner conductor of the coaxial cable in an electrically connected manner. The upper surface of the second contacting member is fixed to the outer conductor of the coaxial cable in an electrically connected manner.

As a result, the coaxial cable can transmit a testing signal and a ground signal by the inner and outer conductors respectively so that the first and second contacting members, which are electrically connected with the inner and outer conductors respectively, attain great impedance matching. Such contact probe is adapted for high frequency test, and the contacting members thereof have high precision, high structural strength and the resulting longer lifespan, further improving the testing accuracy and reliability.

The present invention further provides another contact probe for a probe system for performing a functionality test to a DUT. The contact probe includes a circuit board, and a plurality of above-described contacting members. The circuit board includes a plurality of conductive circuits. The top side of each contacting member includes an upper surface located at the body. The upper surface of each contacting member is partially fixed to the conductive circuit of the circuit board in an electrically connected manner so that the body of each contacting member extends from where the body is fixed to the circuit board and passes over an end of the circuit board in a way that each contacting member includes a cantilever section extending from the end of the circuit board. The contact tip of each contacting member is located at an end of the cantilever section. The tip bottom surfaces of the contacting members are coplanar with each other.

As a result, the circuit board can transmit a testing signal and a ground signal by different conductive circuits respectively so that the contacting members, which are electrically connected with the conductive circuits respectively, attain great impedance matching. Such contact probe is adapted for high frequency test, and the contacting members thereof have high precision, high structural strength and the resulting longer lifespan, further improving the testing accuracy and reliability.

The present invention also provides a method of manufacturing a contacting member for a contact probe for performing a functionality test to a DUT. The method of manufacturing the contacting member includes the steps of:

providing a substrate made of a conductive material and including a relatively thinner region, at least one relatively thicker region, and at least one transition region extending from the relatively thinner region to the relatively thicker region in a way of gradually increasing in thickness, an upside of the substrate including a first surface located at the relatively thinner region, at least one second surface located at the at least one relatively thicker region, and at least one transition surface located at the at least one transition region, the second surface being higher than the first surface, the transition surface extending upwardly from the first surface to the second surface in a way of gradually changing in height; and defining a plurality of contacting members by removing the partial material of the substrate, the step of defining the contacting members including defining a contact tip of each contacting member in the relatively thicker region of the substrate, defining a body of each contacting member in the relatively thinner region of the substrate, and performing a cutting process to the substrate in correspondence with a contour of the contacting members.

As a result, the above-described method can be used to manufacture the above-described contacting member provided by the present invention to make the contacting member have high precision, high structural strength and the resulting longer lifespan, further improving the testing accuracy and reliability.

Preferably, the above-described method of manufacturing the contacting member further includes the step of: sharping the contact tip of each contacting member to provide each contact tip a tip top surface, a tip bottom surface, and a contact end located at the juncture of the tip top surface and the tip bottom surface, wherein the contact end is configured for contacting the DUT.

As a result, after the shape of the contacting member is defined, the contacting member can be further formed with the tip top surface and the tip bottom surface by processing such as lapping, so as to sharp the contact tip and provide the contact end at the required position to make the contact end have even higher precision for precise alignment with the contact pad of the DUT, thereby beneficial for the testing.

Preferably, the substrate includes two transition regions located on two opposite sides of the relatively thinner region respectively, and two relatively thicker regions connected with the two transition regions respectively. The upside of the substrate includes two second surfaces located at the two relatively thicker regions respectively, and two transition surfaces located at the two transition regions respectively. The aforementioned step of defining the contacting members includes defining the contact tip of each contacting member in one of the two relatively thicker regions, and defining the body of each contacting member in the relatively thinner region and the other of the two relatively thicker regions.

In other words, the upside of the substrate includes two relatively higher second surfaces, and a relatively lower first surface located between the two second surfaces. Besides, between each of the two second surfaces and the first surface, there is a transition surface gradually decreasing in height. Defining the contact tip of each contacting member in one of the relatively thicker regions can form the so-called 3D tip structure which allows for better contact of the contact end of the contact tip with the contact pad of the DUT, improving the testing accuracy and reliability. Defining the body of each contacting member in the relatively thinner region and the other relatively thicker region can make the body of the contacting member have the relatively thicker section located relatively farther from the contact tip, which can improve the structural strength of the body of the contacting member, and is beneficial for the body of the contacting member to be fixed to another component for composing the contact probe.

Preferably, the substrate is formed from a flat plate by a surface lowering process. The first surface and the transition surface are produced by the surface lowering process so that the surface roughness of the first surface and the transition surface is different from the surface roughness of the second surface. The surface lowering process is performed prior to the step of defining the plurality of contacting members by removing the partial material of the substrate.

As a result, the surface lowering process may be, for example, chemical etching, laser etching, and so on, making the surface roughness of the first surface and the transition surface, which are produced by the surface lowering process, different from the surface roughness of the second surface which belongs to the original flat plate. Such surface lowering process facilitates manufacture of the substrate having the required height difference and transition surface to make the contacting member formed therefrom have high precision and high structural strength.

The present invention also provides a probe system for performing a functionality test to a DUT that is formed on a substrate and includes a plurality of contact pads. The probe system includes a chuck configured to support the substrate, and a contact probe including a plurality of above-described contacting members for contacting the contact pads of the DUT by the contact ends of the contacting members so that the contact probe is electrically connected with the DUT to perform the functionality test to the DUT.

As a result, the above-described probe system adopts the above-described contacting member provided by the present invention, which has high precision, high structural strength and the resulting longer lifespan, improving the testing accuracy and reliability of the probe system.

The present invention also provides a method of testing an unpackaged semiconductor device, which includes the steps of: providing at least one contact probe, the contact probe including a plurality of above-described contacting members; making the contacting members mechanically and electrically contact a plurality of contact pads of an unpackaged semiconductor device; and testing the unpackaged semiconductor device via the contact probe.

As a result, the contact probe used in the above-described method of testing the unpackaged semiconductor device includes the above-described contacting member provided by the present invention, which has high precision, high structural strength and the resulting longer lifespan, improving the accuracy and reliability of the test performed to the unpackaged semiconductor device.

The present invention also provides a method of producing a tested semiconductor device, which includes the step of: providing at least one contact probe, the contact probe including a plurality of above-described contacting members; making the contacting members mechanically and electrically contact a plurality of contact pads of an unpackaged semiconductor device; and testing the unpackaged semiconductor device via the contact probe.

As a result, the semiconductor device produced by the above-described method has been tested, and the testing uses the above-described contacting member provided by the present invention, which has high precision, high structural strength and the resulting longer lifespan, improving the accuracy and reliability of the testing result of the semiconductor device.

The present invention also provides a tested semiconductor device which has been tested by a testing process performed by at least one contact probe mechanically and electrically contacting the tested semiconductor device. The tested semiconductor device includes a plurality of contact pads. The contact probe includes a plurality of above-described contacting members. The testing process is performed by the contact ends of the contacting members contacting the contact pads of the semiconductor device.

As a result, the above-described semiconductor device has been tested, and the testing uses the above-described contacting member provided by the present invention, which has high precision, high structural strength and the resulting longer lifespan, improving the accuracy and reliability of the testing result of the semiconductor device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
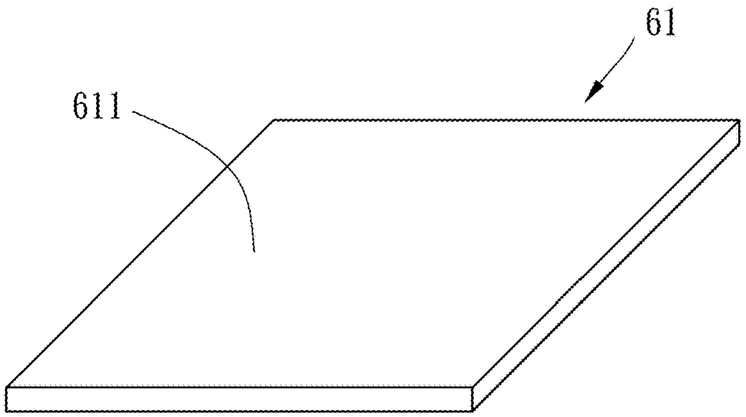
FIG. 1 to FIG. 7 are schematic views showing a method of manufacturing contacting members according to a first preferred embodiment of the present invention.

First of all, it is to be mentioned that same or similar reference numerals used in the following embodiments and the appendix drawings designate same or similar elements or the structural features thereof throughout the specification for the purpose of concise illustration of the present invention. It should be noticed that for the convenience of illustration, the components and the structure shown in the figures are not drawn according to the real scale and amount, and the features mentioned in each embodiment can be applied in the other embodiments if the application is possible in practice. Besides, when it is mentioned that an element is disposed on another element, it means that the former element is directly disposed on the latter element, or the former element is indirectly disposed on the latter element through one or more other elements between aforesaid former and latter elements. When it is mentioned that an element is directly disposed on another element, it means that no other element is disposed between aforesaid former and latter elements.

Figure 2:
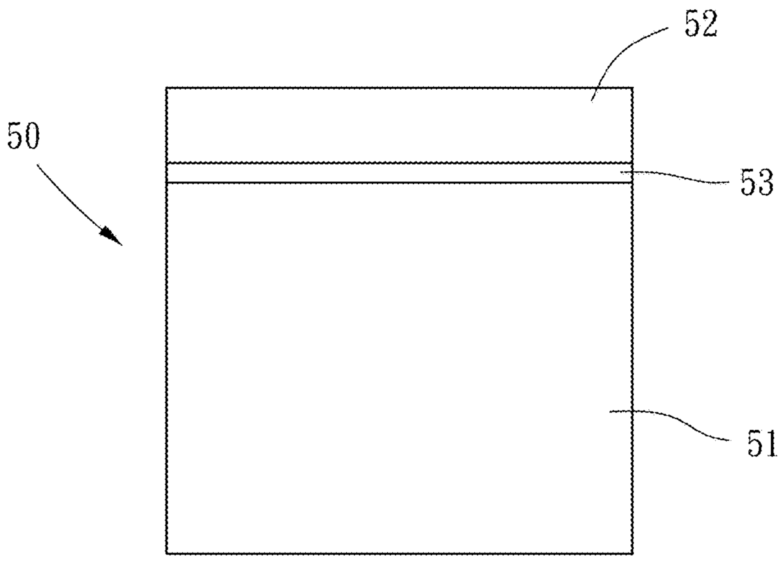
Figure 3:
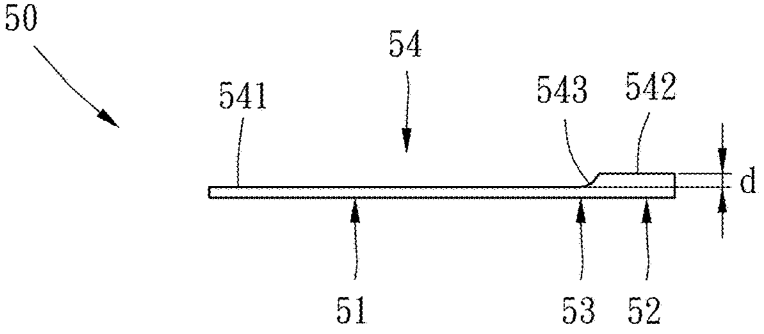
Figure 4:
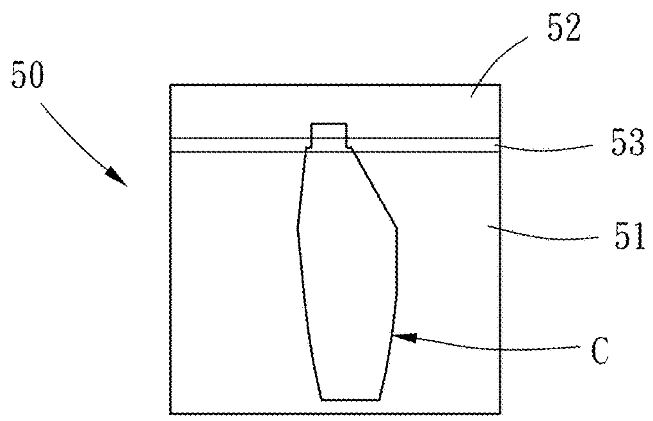
Figure 5:
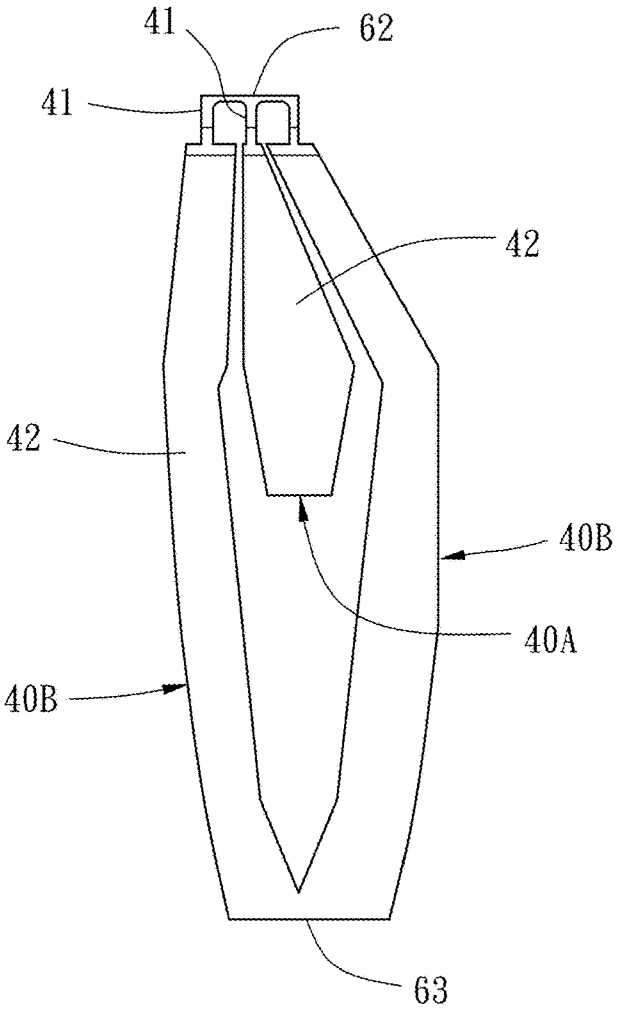

Referring to FIG. 1 to FIG. 8, a method of manufacturing a contacting member according to a first preferred embodiment of the present invention is adapted for manufacturing contacting members 40A and 40B of a contact probe 30 as shown in FIG. 5. The method includes the following step a) to step c).

a) As shown in FIG. 1 to FIG. 3, provide a substrate 50 made of a conductive material. The substrate 50 includes a relatively thinner region 51, a relatively thicker region 52, and a transition region 53 extending from the relatively thinner region 51 to the relatively thicker region 52 in a way of gradually increasing in thickness. An upside 54 of the substrate 50 includes a first surface 541 located at the relatively thinner region 51, a second surface 542 located at the relatively thicker region 52, and a transition surface 543 located at the transition region 53. The second surface 542 is higher than the first surface 541. The transition surface 543 extends upwardly from the first surface 541 to the second surface 542 in a way of gradually changing in height.

Further speaking, the substrate 50 provided in this step is as shown in FIG. 2 and FIG. 3. This substrate 50 is formed from a flat plate 61 as shown in FIG. 1 by a surface lowering process. The surface lowering process may be, for example, chemical etching, laser etching, and so on, for reducing the thickness of a part of the flat plate 61 so that an upward plane 611 of the flat plate 61 is partially lowered and thereby the first surface 541 and the transition surface 543 of the substrate 50 are produced. The non-lowered part of the plane 611 of the flat plate 61 becomes the second surface 542 of the substrate 50. Therefore, the surface roughness of the first surface 541 and the transition surface 543, which are produced by the surface lowering process, is different from the surface roughness of the second surface 542 which comes from the plane 611 of the original flat plate 61. By this surface lowering process, the required substrate 50 can be conveniently and fast manufactured in a way that the first surface 541 and second surface 542 thereof have a predetermined height difference d therebetween, and the transition surface 543 smoothly connects the first surface 541 and the second surface 542. For example, the thickness of the relatively thinner region 51 is 60 micrometers, the thickness of the relatively thicker region 52 is 80 micrometers, and the height difference d is 20 micrometers. The surface roughness refers to surface profile height difference (roughness), which is specifically the average of the absolute value deviations of the real surface profile with respect to an average line, also referred to as Ra. Therefore, object surface difference can be obviously seen through a microscope, such as difference in luster, brightness, and so on. Besides, the difference in surface roughness includes that after a surface coating process, such as gold plating process, the object surface difference, such as difference in luster, brightness, and so on, can be still obviously seen through a microscope.

b) As shown in FIG. 4 and FIG. 5, define a plurality of contacting members 40A and 40B by removing partial material of the substrate 50. Defining the contacting members 40A and 40B includes defining a contact tip 41 of each of the contacting members 40A and 40B in the relatively thicker region 52 of the substrate 50, defining a body 42 of each of the contacting members 40A and 40B in the relatively thinner region 51 of the substrate 50, and performing a cutting process to the substrate 50 in correspondence with a contour C of the contacting members 40A and 40B.

It can be seen from FIG. 4 and FIG. 5 that three contacting members 40A and 40B are manufactured at the same time by the manufacturing method in this embodiment. In this step, the cutting process is not only performed in correspondence with the mutual contour C of the three contacting members 40A and 40B, but also performed in correspondence with the required shape of each of the contacting members 40A and 40B. During the cutting process, the position of the contact tip 41 with respect to the body 42 can be adjusted according to the requirements. The position of the contact tip 41 is unlimited to the center of an end surface of the body 42. It can be seen from FIG. 5 that these three contacting members 40A and 40B include a relatively shorter contacting member 40A and two relatively longer contacting members 40B. In the present invention, the contacting member 40A is also referred to as first contacting member, and the contacting member 40B is also referred to as second contacting member. The contacting member 40A is located between the contacting members 40B. In this step, the contact tips 41 of these three contacting members 40A and 40B are still connected by a connecting portion 62, and the bodies 42 of the two contacting members 40B are still connected by another connecting portion 63. When the manufacture of the contacting members 40A and 40B is accomplished, the connecting portion 62 is removed or cut through the tip sharping process that will be described hereinafter, so that the contact tips 41 of the contacting members 40A and 40B are separated from each other. The three contacting members 40A and 40B shown in FIG. 5 are used to be composed of a probe having three probe tips. According to the testing requirements, the probe can include any proper amount of probe tip, such as one probe tip, two probe tips, three probe tips, or more than three probe tips. The common arrangement of two probe tips includes a signal probe tip and a ground probe tip, which is also referred to as a GS (ground-signal) probe tip configuration. The common arrangement of three probe tips, as shown in FIG. 5, includes a centrally located signal probe tip (i.e. the contacting member 40A) flanked by a pair of ground probe tips (i.e. the two contacting members 40B), which is also referred to as a GSG (ground-signal-ground) probe tip configuration. It is instanced in FIG. 4 that a GSG probe having a contour C composed by three contacting members 40A and 40B collectively is defined on the substrate 50, but this step is unlimited thereto. For example, a plurality of probes having the same and/or different contours C can be defined on the substrate 50.

Figure 6:
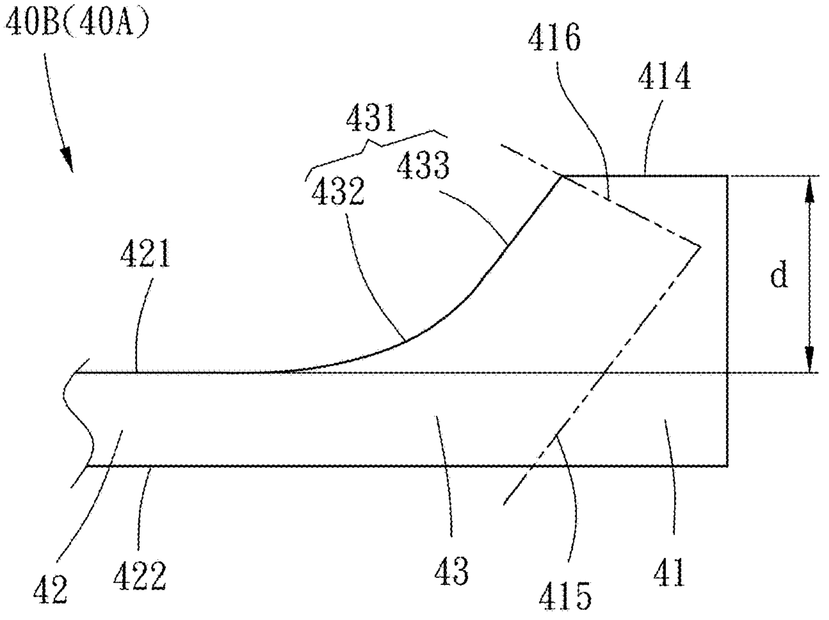
Figure 7:
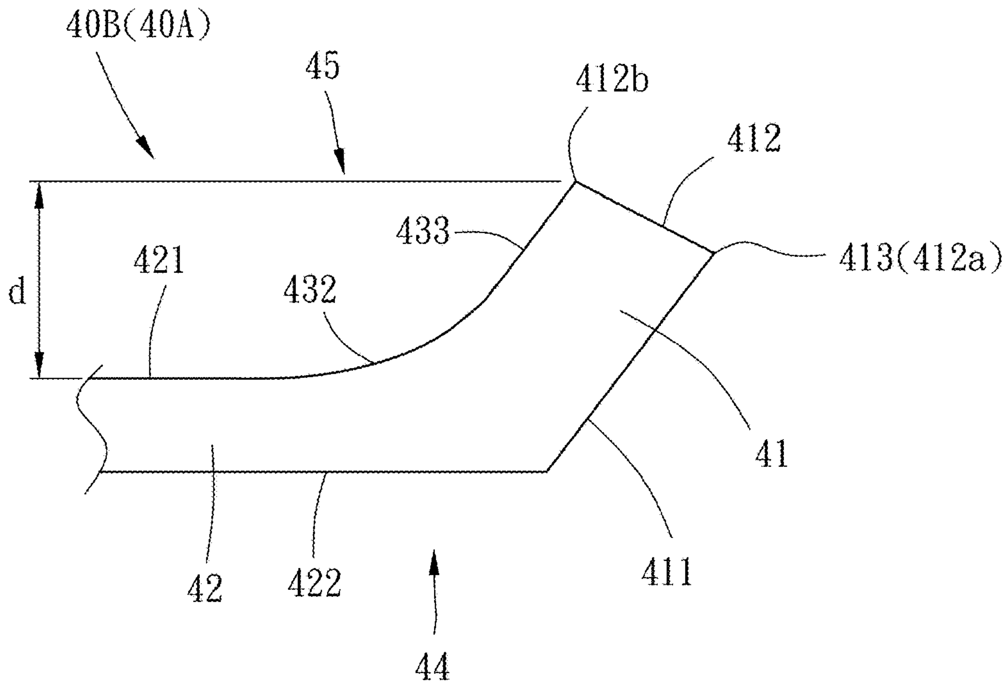

When this step b) is finished, the contacting members 40A and 40B all have the side shape as shown in FIG. 6. Each of the contacting members 40A and 40B includes a contact tip 41 formed from the relatively thicker region 52 of the substrate 50, the body 42 formed from the relatively thinner region 51 of the substrate 50, and a tip transition section 43 formed from the transition region 53 of the substrate 50 and located between the body 42 and the contact tip 41.

c) As shown in FIG. 6 and FIG. 7, perform a tip sharping process, such as lapping with abrasive cloth, to the contact tip 41 of each of the contacting members 40A and 40B to provide each contact tip 41 a tip top surface 411, a tip bottom surface 412, and a contact end 413 located at the juncture of the tip top surface 411 and the tip bottom surface 412. The contact end 413 is configured for contacting a contact pad 231 of a DUT 23, as shown in FIG. 10.

Figure 10:
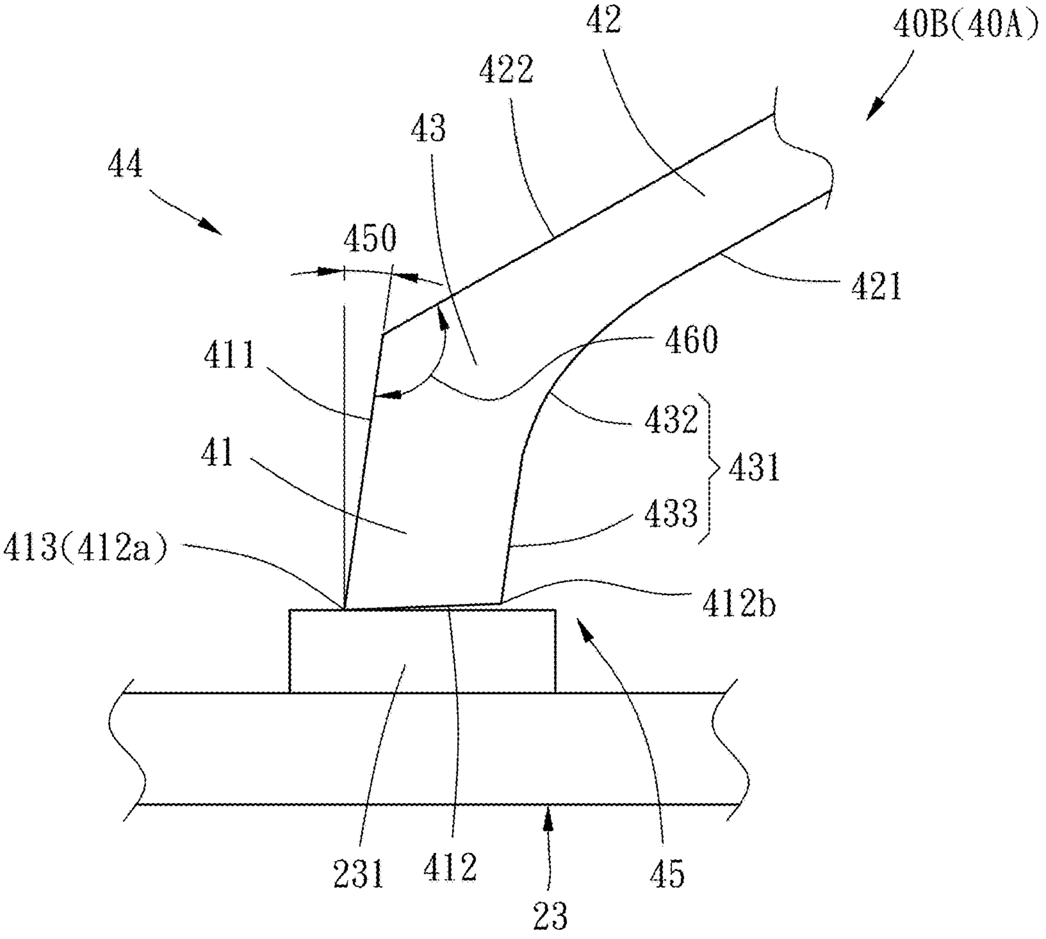
FIG. 10 is a schematic view showing a part of the contacting member according to the first preferred embodiment of the present invention and a device under test.

It should be mentioned here that FIG. 7 shows the orientation of the contacting members 40A and 40B in the manufacturing process thereof, but the orientation thereof in practical use is as shown in FIG. 10. More specifically speaking, each of the contacting members 40A and 40B includes a top side 44 and a bottom side 45. FIG. 7 shows the status that the bottom side 45 faces upwardly. When the contacting members 40A and 40B perform a functionality test to the DUT 23, as shown in FIG. 10, the bottom side 45 of each of the contacting members 40A and 40B faces toward the DUT 23.

As shown in FIG. 7 and FIG. 10, the bottom side 45 of each of the contacting members 40A and 40B includes a lower surface 421 located at the body 42, the tip bottom surface 412 located at the contact tip 41, and a tip transition surface 431 located at the tip transition section 43. The contact end 413 is located on a front side 412*a* of the tip bottom surface 412. A rear side 412*b* of the tip bottom surface 412 and the lower surface 421 have the above-described height difference d therebetween. The tip transition surface 431 extends from the lower surface 421 to the rear side 412*b* of the tip bottom surface 412 in a way of gradually changing in height. The top side 44 of each of the contacting members 40A and 40B includes an upper surface 422 located at the body 42, and the tip top surface 411 located at the contact tip 41. The tip top surface 411 extends from the upper surface 422 to the contact end 413 inclinedly with respect to the upper surface 422. Because the lower surface 421 of the body 42 and the tip transition surface 431 of the tip transition section 43 are formed from the first surface 541 and the transition surface 543 of the substrate 50 as shown in FIG. 3 respectively, the surface roughness of the lower surface 421 and the tip transition surface 431 is different from the surface roughness of the tip bottom surface 412, the tip top surface 411 or the upper surface 422. Further speaking, in the above-described tip sharping process, the contact tips 41 of the contacting members 40A and 40B are processed by lapping at the same time along imaginary lines 415 and 416 as shown in FIG. 6. The lapping is firstly performed along the imaginary line 415 to make the contact ends 413 of the contacting members 40A and 40B aligned with each other, and then the lapping is performed along the imaginary line 416 to make the tip bottom surfaces 412 of the contacting members 40A and 40B identical in planarization.

After the step b) is performed to define the shape of the contacting members 40A and 40B, this step c) is performed for further sharping the contact tip 41, so as to facilitate the contact of the contact end 413 with the contact pad 231 of the DUT 23 and further adjust the position of the contact end 413 to precisely provide the contact end 413 at the required position, improving the precision of the contact end 413 for precise alignment with the contact pad 231 of the DUT 23, thereby beneficial for the testing. The tip bottom surface 412 formed in this step c) is unlimited to be connected to the tip transition surface 431. The plane 414 of the contact tip 41 shown in FIG. 6 can be partially preserved so that the tip bottom surface includes the surface formed in this step c) and a part of the plane 414. Alternatively, the method of manufacturing the contacting member of the present invention may not include this step c). The contacting members 40A and 40B without being sharped through this step c) are as shown in FIG. 6. Such contacting members 40A and 40B still have, at the upper right thereof in FIG. 6, the right-angled corner to serve as the contact end for contacting the contact pad 231 of the DUT 23, such that in this case the plane 414 is the tip bottom surface. Referring to FIG. 10, as described above, when the front side 412*a* of the tip bottom surface 412 and the contact pad 231 of the DUT 23 are in contact with each other, the tip top surface 411 located on the farther side of the contact tip 41 from the DUT is inclined backwardly from the vertical direction for a specific angle 450. Therefore, referring to FIG. 10, the tip top surface 411 extends with an inner obtuse angle 460 larger than 90 degrees with respect to the upper surface 422 of the body 42. Therefore, when the operator looks the contact tip 41 through a microscope or camera downwardly, the operator will observe the positional relation between the contact end 413 and the contact pad 231 to ascertain the relative position of every contact tip 41 with respect to its associated contact pad 231, thereby beneficial for alignment.

Figure 8:
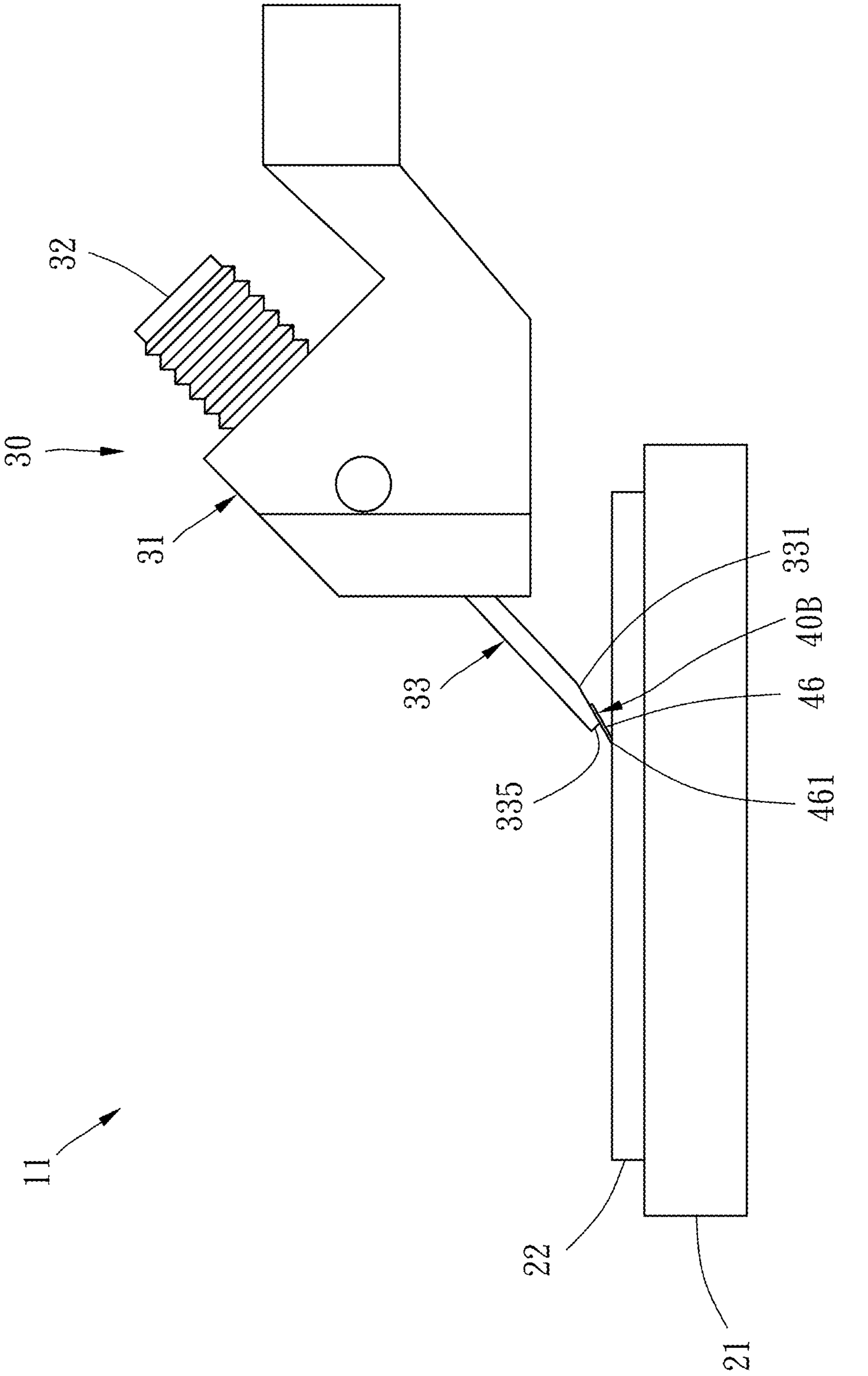
FIG. 8 is a schematic side view of a probe system according to the first preferred embodiment of the present invention.

As shown in FIG. 8, this embodiment provides a probe system 11 which includes a chuck 21, and a contact probe 30. The contact probe 30 includes a base 31, a coaxial connector 32 fixed to the base 31, a coaxial cable 33 fixed to the base 31 and electrically connected with the coaxial connector 32, and the above-described three contacting members 40A and 40B. These three contacting members 40A and 40B are arranged parallel to each other. In FIG. 8, the lateral side of only one contacting member 40B is schematically, and the other two contacting members 40A and 40B are hidden by the contacting member 40B and thus unshown.

Figure 9:
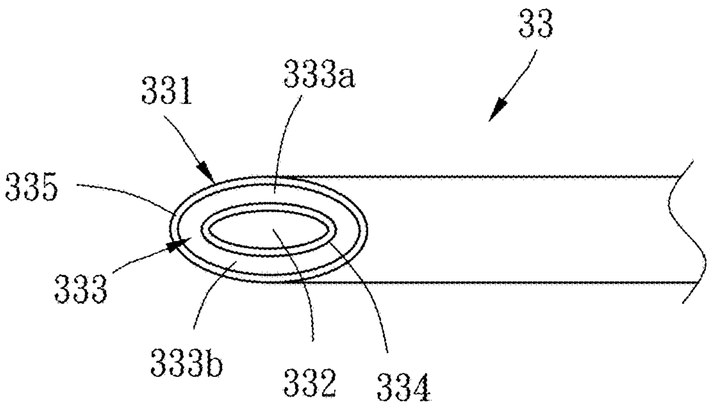
FIG. 9 is a schematic bottom view of a coaxial cable of a contact probe of the probe system according to the first preferred embodiment of the present invention.

Further speaking, the coaxial cable 33 is cut with an inclined surface 331 for the inner structure of the coaxial cable 33 to be exposed on the inclined surface 331 in a relatively larger area manner, as shown in FIG. 9. The inside of the coaxial cable 33 includes an inner conductor 332, an outer conductor 333, and a dielectric 334 disposed between the inner conductor 332 and the outer conductor 333. The upper surfaces 422 of the contacting members 40A and 40B are partially fixed to the inclined surface 331 of the coaxial cable 33 separately. For example, the angle of the inclined surface 331 of the coaxial cable 33 with respect to the horizontal plane is 45 degrees, so that the installation angle of the contacting members 40A and 40B fixed to the coaxial cable 33 is 45 degrees, which means the angle of the upper surfaces 422 of the contacting members 40A and 40B with respect to the horizontal plane is 45 degrees. More specifically speaking, the upper surface 422 of the contacting member 40A (first contacting member) is fixed to the inner conductor 332 in an electrically connected manner. The upper surfaces 422 of the two contacting members 40B (second contacting members) are respectively fixed, in an electrically connected manner, to two areas 333*a* and 333*b* of the outer conductor 333, which are located on two opposite sides of the inner conductor 332. The bodies 42 of the three contacting members 40A and 40B all extend from where they are fixed to the inclined surface 331 to the left shown in FIG. 9 and pass over an end 335 of the coaxial cable 33 so that each of the contacting members 40A and 40B includes a cantilever section 46 extending from the end 335 of the coaxial cable 33, as shown in FIG. 8. The cantilever section 46 includes a part of the body 42 and the entire tip transition section 43 and contact tip 41. The contact tip 41 is located at an end 461 of the cantilever section 46, and the tip bottom surfaces 412 of the three contacting members 40A and 40B are coplanar with each other. In the above-described manufacturing method, the three contacting members 40A and 40B are manufactured at the same time, that makes it easier to make the contacting members 40A and 40B coplanar with each other.

As shown in FIG. 8, the probe system 11 is adapted for performing a functionality test to the DUT 23 (as shown in FIG. 10) formed on a substrate 22. The substrate 22 is supported by the chuck 21 of the probe system 11. For example, the substrate 22 is a wafer. The DUT 23 is an unpackaged semiconductor device on the wafer. The DUT 23 is tiny in practice, so the DUT 23 is unshown in FIG. 8. The DUT 23 is only schematically shown in FIG. 10. The DUT 23 includes a plurality of contact pads 231, and only one of the contact pads 231 is schematically shown in FIG. 10. The contact probe 30 is configured to contact the contact pads 231 of the DUT 23 by the contact ends 413 of the contacting members 40A and 40B respectively so that the contact probe 30 is electrically connected with the DUT 23. At this time, the tip bottom surface 412 of each of the contacting members 40A and 40B is slightly inclined upward with respect to the surface of the contact pad 231 of the DUT 23 with an included angle therebetween, which is, for example, smaller than 7 degrees, as shown in FIG. 10. When the coaxial connector 32 of the contact probe 30 is electrically connected to a tester (not shown) through another coaxial cable (not shown), the contacting members 40A and 40B can contact the contact pads 231 of the DUT 23 to perform a functionality test to the DUT 23. The inner conductor 332 of the coaxial cable 33 can transmit a testing signal, and the outer conductor 333 can transmit a ground signal, so that the contacting member 40A transmits the testing signal and the contacting members 40B transmit the ground signal. By the arrangement that the contacting members 40B for transmitting the ground signal are disposed by two sides of the contacting member 40A for transmitting the testing signal in a transversely spaced apart manner, a controlled impedance transmission line can be formed to attain great impedance matching effect, so that the contact probe 30 is adapted for high frequency test.

As a result, the bottom side 45 of each of the contacting members 40A and 40B of the present invention, which is the side for facing toward the DUT 23, has the height difference d between the contact tip 41 and the body 42. Therefore, each of the contacting members 40A and 40B has the so-called 3D tip structure, which allows for better contact of the contact end 413 of the contact tip 41 with the contact pad 231 of the DUT 23, improving the testing accuracy and reliability. Besides, there is the tip transition section 43 between the contact tip 41 and the body 42. The tip transition surface 431 extends from the lower surface 421 of the body 42 to the tip bottom surface 412 in a way of gradually changing in height, which means the tip transition surface 431 is not configured as a vertical surface or other configurations with abrupt turning, but smoothly connects the lower surface 421 and the tip bottom surface 412 having the height difference d therebetween. This arrangement can reduce stress concentration and improve the structural integrity, so that the contacting members 40A and 40B may have high structural strength, thereby achieving great durability and reliability.

In addition, the contacting members 40A and 40B are formed from the substrate 50 having the height difference d by the cutting process. In other words, the height difference d between the contact tip 41 and the body 42 of each of the contacting members 40A and 40B comes from the height difference d of the substrate 50, not formed by MEMS technology of stacking multiple layers on top of each other. Such contacting members 40A and 40B are each monolithically formed without the need of bending. It only needs the cutting process to define the shape of the contacting members 40A and 40B, thereby reducing stress concentration and improving structural integrity, so that the contacting members 40A and 40B have high structural strength and the resulting longer lifespan. Besides, the cutting process, such as laser cutting, EDM cutting, and so on, allows for high precision in defining the required shape of the contacting members 40A and 40B by cutting, especially making the contact ends 413 of the contact tips 41 have high positional precision for precise alignment with the contact pads 231 of the DUT 23, thereby beneficial for the testing.

As shown in FIG. 10, in this embodiment, the tip transition surface 431 of each of the contacting members 40A and 40B includes a gradual transition curve 432 and an inclined plane 433. The gradual transition curve 432 is directly connected with the lower surface 421 of the body 42, and extends toward the rear side 412*b* of the tip bottom surface 412. The gradual transition curve 432 has a radius of curvature that gradually changes along its length, allowing it to smoothly achieve the height difference without any abrupt change in curvature. The inclined plane 433 is connected between the gradual transition curve 432 and the rear side 412*b* of the tip bottom surface 412. The inclined plane 433 can also smoothly achieve the height difference to a certain extent. In other words, although the gradual transition curve 432 achieves the height difference in a relatively more smooth manner, better in stress concentration reducing effect than the inclined plane 433, the gradual transition curve 432 and the inclined plane 433 are both effective in reducing stress concentration and improving the structural integrity, making the contacting members 40A and 40B have even higher structural strength. According to different manufacturing process, the entire tip transition surface 431 may be a gradual transition curve 432, which may be produced by chemical etching for example, or the entire tip transition surface 431 may be an inclined plane 433. Alternatively, the tip transition surface 431 may include both the gradual transition curve 432 and the inclined plane 433, as illustrated in this embodiment.

Besides, in this embodiment, the height difference d between the contact tip 41 and the body 42 of each of the contacting members 40A and 40B is produced by the surface lowering process performed on the plane 611 of the flat plate 61 as shown in FIG. 1. The first surface 541 is formed as a plane by this surface lowering process, as shown in FIG. 3. Thereafter, the lower surface 421 of each of the contacting members 40A and 40B is formed from the first surface 541, so the lower surface 421 of each of the contacting members 40A and 40B is a plane. Making the first surface 541 as a plane to make the lower surface 421 of each of the contacting members 40A and 40B as a plane is not only easier in manufacture, but also brings the body 42 of each of the contacting members 40A and 40B high structural integrity and high structural strength.

Figure 11:
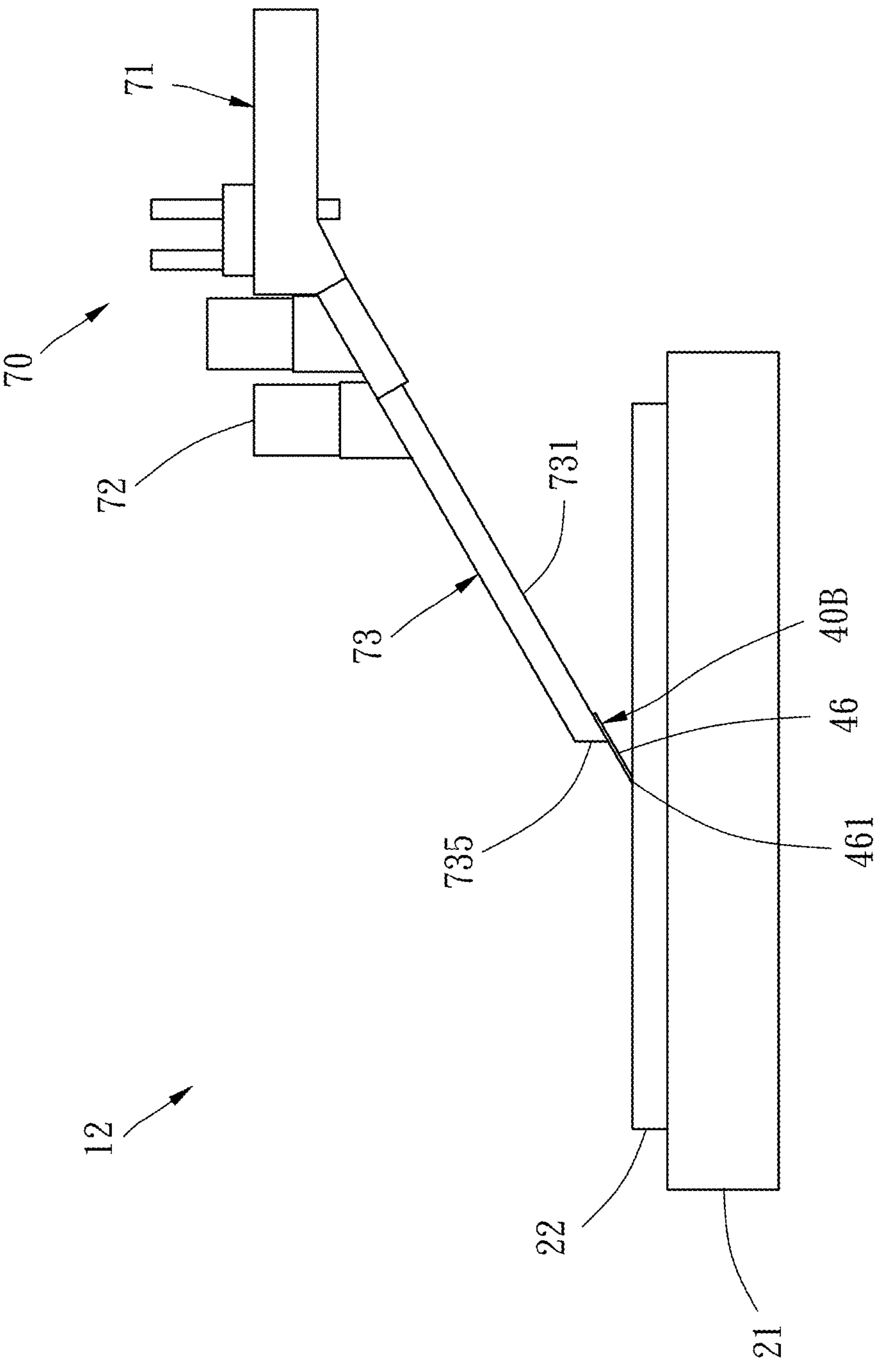
FIG. 11 is a schematic side view of a probe system according to a second preferred embodiment of the present invention.

The contacting members 40A and 40B provided by the present invention are unlimited to the application in the probe system 11 as shown in FIG. 8, but can be applied to, for example, a probe system 12 according to a second preferred embodiment of the present invention as shown in FIG. 11. The probe system 12 is similar to the probe system 11, but adopting a different kind of contact probe 70. The contact probe 70 includes a base 71, at least one coaxial connector 72 fixed to the base 71, a circuit board 73 fixed to the base 71 and electrically connected with the coaxial connector 72, and three contacting members 40A and 40B, which are the same with those in the first preferred embodiment. These three contacting members 40A and 40B are arranged parallel to each other on a bottom surface 731 of the circuit board 73. In FIG. 11, the lateral side of only one contacting member 40B is schematically shown, and the other two contacting members 40A and 40B are hidden by the contacting member 40B and thus unshown.

Figure 12:
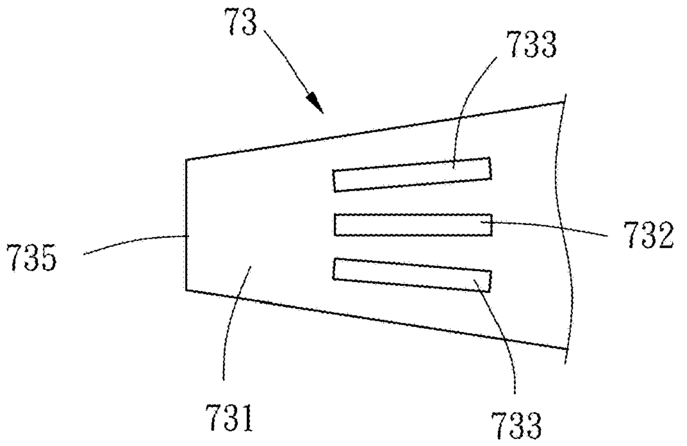
FIG. 12 is a schematic bottom view of a circuit board of a contact probe of the probe system according to the second preferred embodiment of the present invention.

Further speaking, as shown in FIG. 12, the bottom surface 731 of the circuit board 73 is provided with a conductive circuit 732, and two conductive circuits 733 located by two opposite sides of the conductive circuit 732 respectively. The upper surface 422 of the contacting member 40A (first contacting member) is partially fixed to the conductive circuit 732 in an electrically connected manner. The upper surfaces 422 of the two contacting members 40B (second contacting members) are partially fixed to the conductive circuits 733 respectively in an electrically connected manner. The bodies 42 of the three contacting members 40A and 40B all extend from where they are fixed to the circuit board 73 to the left shown in FIG. 12 and pass over an end 735 of the circuit board 73 so that each of the contacting members 40A and 40B includes a cantilever section 46 extending from the end 735 of the circuit board 73, as shown in FIG. 11. The cantilever section 46 includes a part of the body 42 and the entire tip transition section 43 and contact tip 41. The contact tip 41 is located at an end 461 of the cantilever section 46, and the tip bottom surfaces 412 of the three contacting members 40A and 40B are coplanar with each other.

In other words, compared with the contact probe 30 in the first preferred embodiment, the primary difference of the contact probe 70 in this embodiment lies in replacing the coaxial cable 33 by the circuit board 73. Such contact probe 70 can also perform a functionality test to the DUT 23. The conductive circuit 732 of the circuit board 73 can transmit a testing signal, and the conductive circuits 733 can transmit a ground signal, so that the contacting member 40A transmits the testing signal and the contacting members 40B transmit the ground signal. By the arrangement that the contacting members 40B for transmitting the ground signal are disposed by two sides of the contacting member 40A for transmitting the testing signal in a transversely spaced apart manner, a controlled impedance transmission line can be formed to attain great impedance matching effect, so that the contact probe 70 is adapted for high frequency test.

Referring to FIG. 13 to FIG. 16, a third preferred embodiment of the present invention provides contacting members 40C and 40D of another type, and a method of manufacturing the contacting members 40C and 40D. In the present invention, the contacting members 40C and 40D are also referred to as first contacting member and second contacting member respectively.

Figure 13:
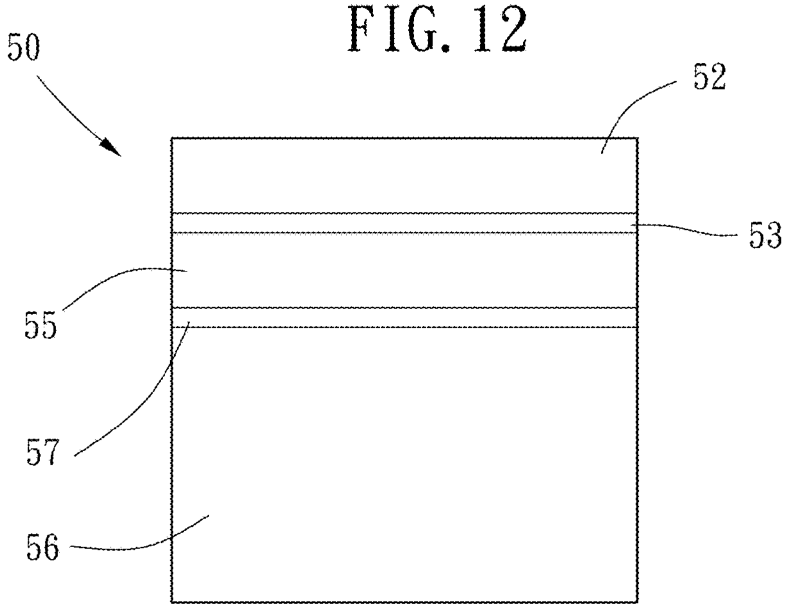
FIG. 13 to FIG. 15 are schematic views showing a method of manufacturing contacting members according to a third preferred embodiment of the present invention.
Figure 14:
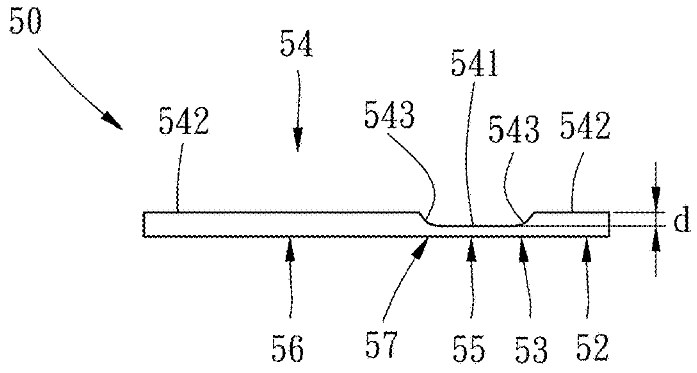

The method of manufacturing the contacting members 40C and 40D is similar to the above-described method of manufacturing the contacting members 40A and 40B, also including the above-described step a) to step c), but the primary difference therebetween lies in that the relatively thinner region 51 of the substrate 50 as shown in FIG. 2 is replaced by a relatively thinner region 55, a relatively thicker region 56 and a transition region 57 in this embodiment, as shown in FIG. 13 and FIG. 14. In other words, the substrate 50 provided in the step a) in this embodiment includes a relatively thinner region 55, two transition regions 53 and 57 located on two opposite sides of the relatively thinner region 55 respectively, and two relatively thicker regions 52 and 56 connected with the transition regions 53 and 57 respectively. The transition regions 53 and 57 extend from the relatively thinner region 55 to the relatively thicker regions 52 and 56 respectively in a way of gradually increasing in thickness, so the upside 54 of the substrate 50 includes a first surface 541 located at the relatively thinner region 55, two second surfaces 542 located at the relatively thicker regions 52 and 56 respectively, and two transition surfaces 543 located at the transition regions 53 and 57 respectively. The two second surfaces 542 are both higher than the first surface 541, and have the same height difference d from the first surface 541. The two transition surfaces 543 have the same shape, which extend upwardly from the first surface 541 to the second surfaces 542 in a way of gradually changing in height.

Further speaking, the substrate 50 provided in the step a) in this embodiment is also formed from the flat plate 61 as shown in FIG. 1 by a surface lowering process, but the lowered area of the plane 611 of the flat plate 61 is relatively smaller in this embodiment. The flat plate 61 is partially lowered and thereby the first surface 541 and the transition surfaces 543 of the substrate 50 are produced. The non-lowered parts of the plane 611 of the flat plate 61 becomes the second surfaces 542 of the substrate 50.

Figure 15:
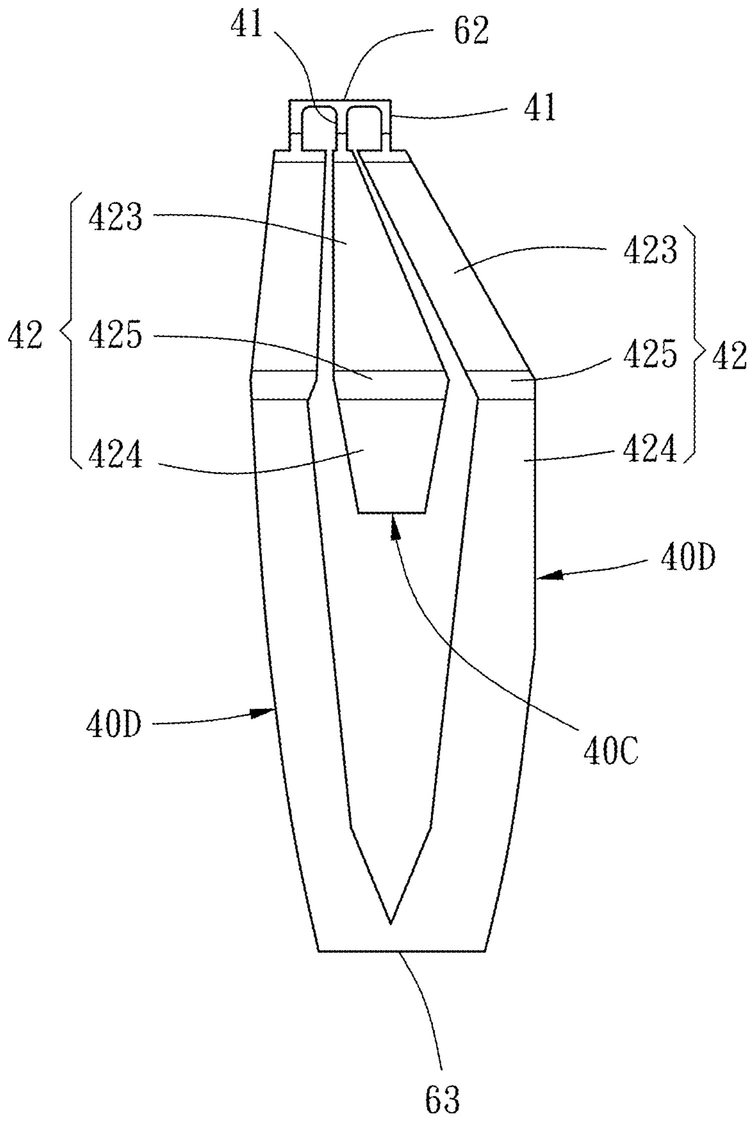
Figure 16:
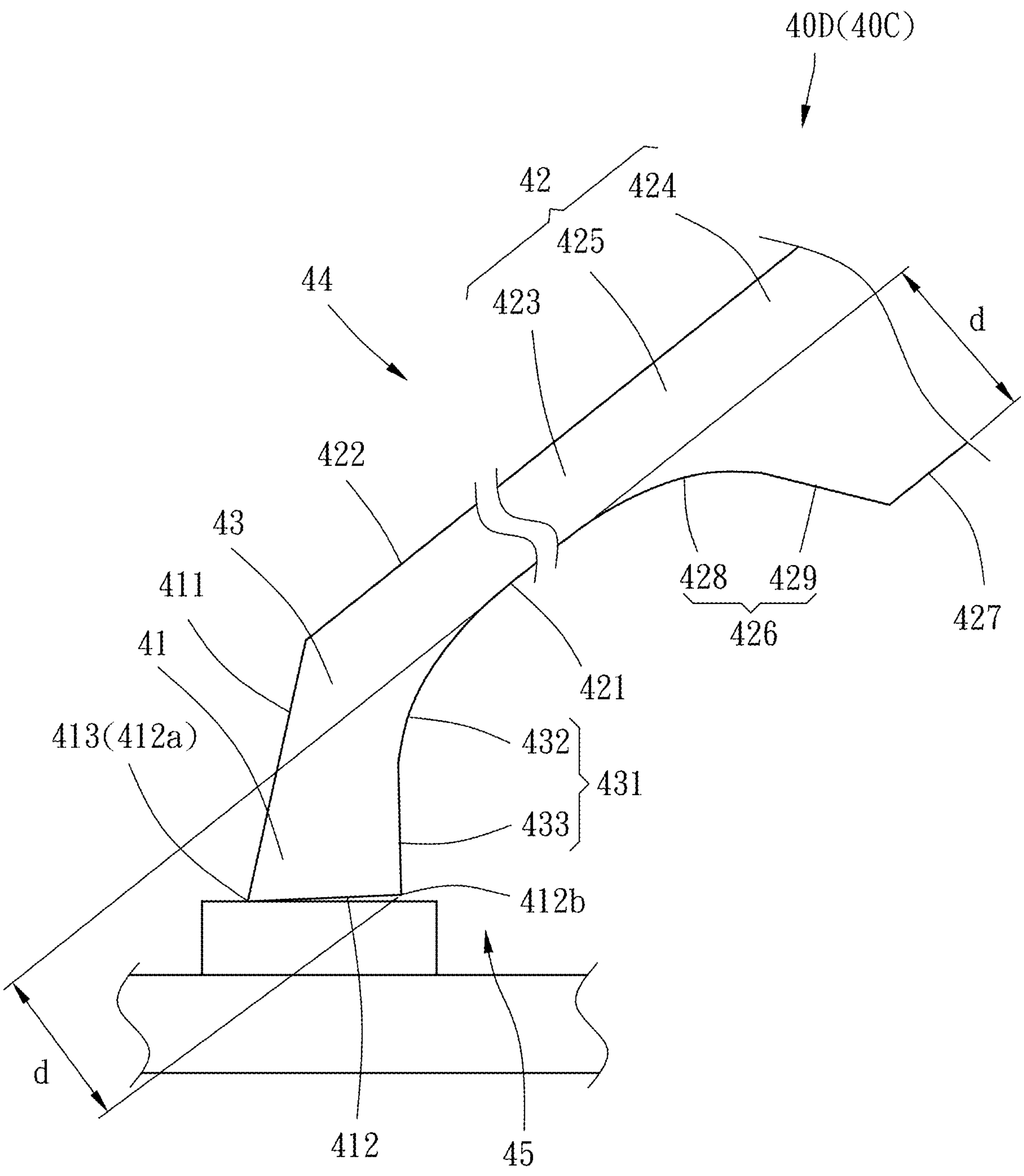
FIG. 16 is a schematic view showing a part of the contacting member according to the third preferred embodiment of the present invention and a device under test.

Referring to FIG. 13 and FIG. 15, in the step b) in this embodiment, defining the contacting members 40C and 40D includes defining a contact tip 41 of each of the contacting members 40C and 40D in the relatively thicker region 52, and defining the body 42 of each of the contacting members 40C and 40D in the relatively thinner region 55, the transition region 57 and the relatively thicker region 56. After that, the contact tip 41 of each of the contacting members 40C and 40D is sharped in the step c) so that the contacting members 40C and 40D are as shown in FIG. 16.

In this way, the contacting members 40C and 40D in this embodiment have the same contact tip 41 and tip transition section 43 with the above-described contacting members 40A and 40B. However, the body 42 of each of the contacting members 40C and 40D in this embodiment includes a relatively thinner section 423 formed from the relatively thinner region 55 of the substrate 50, a relatively thicker section 424 formed from the relatively thicker region 56 of the substrate 50, and a body transition section 425 formed from the transition region 57 of the substrate 50 and located between the relatively thinner section 423 and the relatively thicker section 424. The bottom side 45 of each of the contacting members 40C and 40D includes a tip bottom surface 412 located at the contact tip 41, a tip transition surface 431 located at the tip transition section 43, a lower surface 421 located at the relatively thinner section 423 of the body 42, a body transition surface 426 located at the body transition section 425, and a body bottom surface 427 located at the relatively thicker section 424 of the body 42. Not only the rear side 412*b* of the tip bottom surface 412 and the lower surface 421 have the height difference d therebetween, but the body bottom surface 427 and the lower surface 421 also have the height difference d therebetween. The body transition surface 426 extends from the lower surface 421 to the body bottom surface 427 in a way of gradually changing in height. More specifically speaking, the body transition surface 426 includes a gradual transition curve 428 and an inclined plane 429, which are similar to the gradual transition curve 432 and inclined plane 433 of the tip transition surface 431. The tip transition surface 431, the body transition surface 426 and the lower surface 421 are formed from the transition surfaces 543 and the first surface 541 shown in FIG. 14 respectively, which means they are formed from the surfaces produced by the surface lowering process. Therefore, the surface roughness of the tip transition surface 431, the body transition surface 426 and the lower surface 421 is different from the surface roughness of the tip bottom surface 412, the tip top surface 411, the upper surface 422 or the body bottom surface 427.

As a result, the contacting members 40C and 40D in this embodiment can attain the same effects with the above-described contacting members 40A and 40B. Besides, the body 42 of each of the contacting members 40C and 40D has a section located relatively farther from the contact tip 41 and relatively larger in thickness, i.e. the relatively thicker section 424, which can improve the structural strength of the body 42 of each of the contacting members 40C and 40D, and beneficial for the body 42 of each of the contacting members 40C and 40D to be fixed to another component for composing the contact probe. For example, the relatively thicker sections 424 of the bodies 42 of the contacting members 40C and 40D can be fixed to the inclined surface 331 of the coaxial cable 33 as shown in FIG. 9 to compose the contact probe 30 as shown in FIG. 8. Alternatively, the relatively thicker sections 424 of the bodies 42 of the contacting members 40C and 40D can be fixed to the circuit board 73 as shown in FIG. 12 to compose the contact probe 70 as shown in FIG. 11. Besides, the height difference d between the relatively thinner section 423 and the relatively thicker section 424 of the body 42 of each of the contacting members 40C and 40D also comes from the height difference d of the substrate 50. Such contacting members 40C and 40D can be manufactured without involving MEMS technology or bending the contacting member, so that the contacting members 40C and 40D have high precision, high structural strength and the resulting longer lifespan. Besides, the body 42 has the body transition section 425 between the relatively thinner section 423 and the relatively thicker section 424, and the body transition surface 426 thereof gradually changes in height, thereby smoothly connecting the lower surface 421 and the body bottom surface 427 having the height difference d therebetween. This arrangement can reduce stress concentration and improve the structural integrity, so that the contacting members 40C and 40D are even more durable and reliable.

Figure 17:
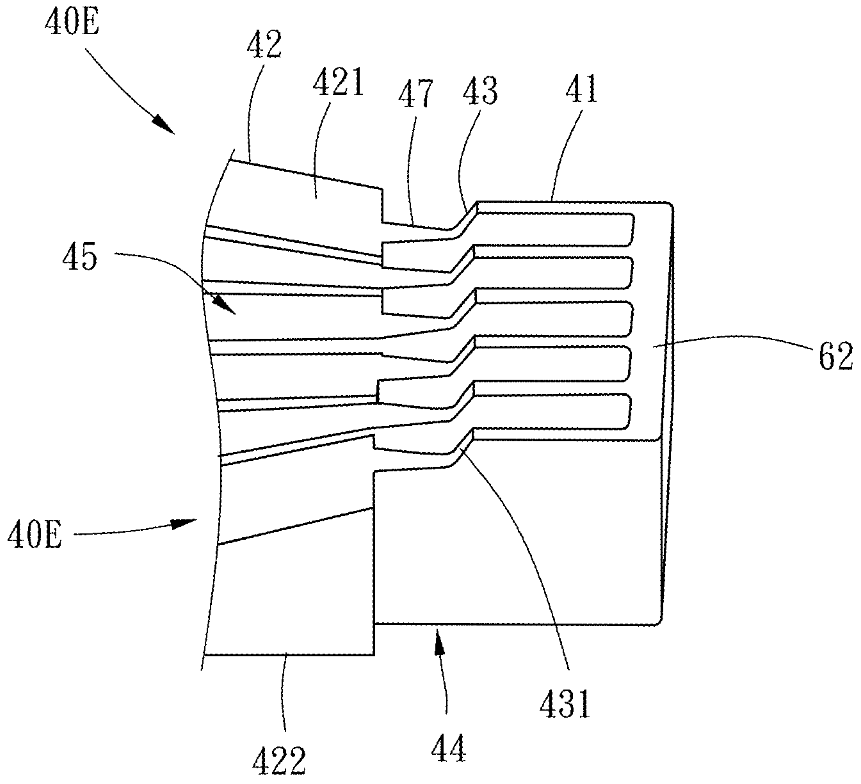
FIG. 17 is a schematic perspective view of parts of contacting members according to a fourth preferred embodiment of the present invention.

Referring to FIG. 17, a fourth preferred embodiment of the present invention provides contacting members 40E of another type. It should be mentioned here that FIG. 17 shows the condition that six contacting members 40E are manufactured at the same time, and these six contacting members 40E are still in the status that the contact tips 41 thereof are connected by a connecting portion 62. These six contacting members 40E can be two sets of the contacting members as shown in FIG. 5, or two sets of the contacting members as shown in FIG. 15, which means the body 42 of the contacting member 40E is unlimited to be uniform in thickness or have the height difference d.

Compared with the contacting members 40A-D in each above-described embodiment, the primary difference of the contacting member 40E in this embodiment lies in further including an extending section 47 located between the body 42 and the tip transition section 43. The body 42 is larger in width than the extending section 47, the tip transition section 43 and the contact tip 41. The lower surface 421 is partially located at the extending section 47. In other words, on the bottom side 45 of the contacting member 40E, which is the side for facing toward the DUT 23, the extending section 47 and the body 42 are coplanar with each other. In other words, the extending section 47 and the contact tip 41 have the height difference d as shown in FIG. 6 therebetween. However, the extending section 47 is narrower than the body 42. The extending section 47 is similar in width to the contact tip 41. Compared with the configuration in each above-described embodiment that the tip transition section 43 is directly connected with the body 42, the configuration in this embodiment that there is the extending section 47 between the tip transition section 43 and the body 42 can make the contacting member 40E provide relatively larger elasticity when the contact tip 41 contacts the contact pad of the DUT, thereby beneficial for the testing.

As described above, the contacting members 40A-E, the contact probes 30 and 70 and the probe systems 11 and 12 provided by the present invention are adapted for performing a functionality test to the unpackaged semiconductor device, i.e. DUT 23, so the present invention further provides a method of testing an unpackaged semiconductor device, a method of producing a tested semiconductor device, and a tested semiconductor device, that will be described hereinafter.

The method of testing an unpackaged semiconductor device includes the steps of: providing at least one contact probe, such as the contact probe 30 or the contact probe 70, the contact probe including a plurality of above-described contacting members, such as the contacting members 40A and 40B or the contacting members 40C and 40D; making the contacting members mechanically and electrically contact a plurality of contact pads of an unpackaged semiconductor device; and testing the unpackaged semiconductor device via the contact probe. The contact probe used in this testing method includes the above-described contacting members provided by the present invention, which have high precision, high structural strength and the resulting longer lifespan, improving the accuracy and reliability of the test performed to the unpackaged semiconductor device.

The method of producing a tested semiconductor device includes the steps of: providing at least one contact probe, such as the contact probe 30 or the contact probe 70, the contact probe including a plurality of above-described contacting members, such as the contacting members 40A and 40B or the contacting members 40C and 40D; making the contacting members mechanically and electrically contact a plurality of contact pads of an unpackaged semiconductor device; and testing the unpackaged semiconductor device via the contact probe. The semiconductor device produced by this method has been tested, and the testing uses the above-described contacting members provided by the present invention, which have high precision, high structural strength and the resulting longer lifespan, improving the accuracy and reliability of the testing result of the semiconductor device.

The tested semiconductor device includes a plurality of contact pads 231. The tested semiconductor device has been tested by a testing process performed by at least one contact probe, such as the contact probe 30 or the contact probe 70, which mechanically and electrically contacts the tested semiconductor device. The contact probe includes a plurality of above-described contacting members, such as the contacting members 40A and 40B or the contacting members 40C and 40D. The testing process is performed by the contact ends 413 of the contacting members contacting the contact pads 231 of the semiconductor device.

As a result, the above-described semiconductor device has been tested, and the testing uses the above-described contacting members provided by the present invention, which have high precision, high structural strength and the resulting longer lifespan, improving the accuracy and reliability of the testing result of the semiconductor device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A contacting member of a contact probe for a probe system for performing a functionality test to a device under test, the contacting member of the contact probe comprising:

a body;

a contact tip comprising a contact end for contacting the device under test; and a tip transition section located between the body and the contact tip;

wherein the contacting member of the contact probe comprises a top side and a bottom side; when the contacting member of the contact probe performs the functionality test to the device under test, the bottom side of the contacting member of the contact probe faces toward the device under test; the bottom side of the contacting member of the contact probe comprises a lower surface located at the body, a tip bottom surface located at the contact tip, and a tip transition surface located at the tip transition section; the contact end is located on a front side of the tip bottom surface; a rear side of the tip bottom surface and the lower surface have a height difference therebetween; the tip transition surface extends from the lower surface to the rear side of the tip bottom surface in a way of gradually changing in height.

2. The contacting member of the contact probe for the probe system for performing the functionality test to the device under test as claimed in claim 1, wherein the contacting member of the contact probe is formed from a substrate having the height difference by a cutting process.

3. The contacting member of the contact probe for the probe system for performing the functionality test to the device under test as claimed in claim 1, wherein the tip transition surface comprises at least one of a gradual transition curve and an inclined plane.

4. The contacting member of the contact probe for the probe system for performing the functionality test to the device under test as claimed in claim 1, wherein surface roughness of the lower surface and the tip transition surface is different from surface roughness of the tip bottom surface.

5. The contacting member of the contact probe for the probe system for performing the functionality test to the device under test as claimed in claim 1, wherein the body comprises a relatively thinner section, a relatively thicker section, and a body transition section located between the relatively thinner section and the relatively thicker section; the lower surface is located at the relatively thinner section; the bottom side of the contacting member of the contact probe further comprises a body bottom surface located at the relatively thicker section of the body, and a body transition surface located at the body transition section; the body bottom surface and the lower surface have the height difference therebetween; the body transition surface extends from the lower surface to the body bottom surface in a way of gradually changing in height.

6. The contacting member of the contact probe for the probe system for performing the functionality test to the device under test as claimed in claim 5, wherein the body transition surface comprises at least one of a gradual transition curve and an inclined plane.

7. The contacting member of the contact probe for the probe system for performing the functionality test to the device under test as claimed in claim 5, wherein surface roughness of the lower surface, the tip transition surface and the body transition surface is different from surface roughness of the body bottom surface.

8. The contacting member of the contact probe for the probe system for performing the functionality test to the device under test as claimed in claim 1, wherein the contacting member of the contact probe further comprises an extending section located between the body and the tip transition section; the body is larger in width than the extending section, the tip transition section and the contact tip; the lower surface is partially located at the extending section.

9. The contacting member of the contact probe for the probe system for performing the functionality test to the device under test as claimed in claim 1, wherein the lower surface is a plane.

10. The contacting member of the contact probe for the probe system for performing the functionality test to the device under test as claimed in claim 1, wherein the top side of the contacting member of the contact probe comprises an upper surface located at the body, and a tip top surface located at the contact tip; the tip top surface extends from the upper surface to the contact end inclinedly with respect to the upper surface.

11. A contact probe for a probe system for performing a functionality test to a device under test, the contact probe comprising:

a coaxial cable comprising an inner conductor, an outer conductor, and a dielectric disposed between the inner conductor and the outer conductor; and a plurality of the contacting members as claimed in claim 1, the top side of each of the plurality of the contacting members of the contact probe comprising an upper surface located at the body, the upper surface of each of the plurality of the contacting members of the contact probe being partially fixed to the coaxial cable so that the body of each of the plurality of the contacting members of the contact probe extends from where the body is fixed to the coaxial cable and passes over an end of the coaxial cable in a way that each of the plurality of the contacting members of the contact probe comprises a cantilever section extending from the end of the coaxial cable, the contact tip of each of the plurality of the contacting members of the contact probe is located at an end of the cantilever section, and the tip bottom surfaces of the plurality of the contacting members of the contact probe are coplanar with each other;

wherein the plurality of the contacting members of the contact probe comprise a first contacting member and at least one second contacting member; the upper surface of the first contacting member is fixed to the inner conductor of the coaxial cable in an electrically connected manner; the upper surface of the second contacting member is fixed to the outer conductor of the coaxial cable in an electrically connected manner.

12. A contact probe for a probe system for performing a functionality test to a device under test, the contact probe comprising:

a circuit board comprising a plurality of conductive circuits; and a plurality of the contacting members as claimed in claim 1, the top side of each of the plurality of the contacting members of the contact probe comprising an upper surface located at the body, the upper surface of each of the plurality of the contacting members of the contact probe being partially fixed to the conductive circuit of the circuit board in an electrically connected manner so that the body of each of the plurality of the contacting members of the contact probe extends from where the body is fixed to the circuit board and passes over an end of the circuit board in a way that each of the plurality of the contacting members of the contact probe comprises a cantilever section extending from the end of the circuit board, the contact tip of each of the plurality of the contacting members of the contact probe is located at an end of the cantilever section, and the tip bottom surfaces of the plurality of the contacting members of the contact probe are coplanar with each other.

13. A probe system for performing a functionality test to a device under test, the device under test being formed on a substrate and comprising a plurality of contact pads, the probe system for performing the functionality test to the device under test comprising:

a chuck configured to support the substrate; and a contact probe comprising a plurality of the contacting members as claimed in claim 1 for contacting the contact pads of the device under test by the contact ends of the plurality of the contacting members for the contact probe so that the contact probe is electrically connected with the device under test to perform the functionality test to the device under test.

14. A method of testing an unpackaged semiconductor device, the method comprising the steps of:

providing at least one contact probe, the contact probe comprising a plurality of the contacting members as claimed in claim 1;

making the plurality of the contacting members for the contact probe mechanically and electrically contact a plurality of contact pads of an unpackaged semiconductor device; and testing the unpackaged semiconductor device via the at least one contact probe.

15. A method of producing a tested semiconductor device, the method comprising the steps of:

providing at least one contact probe, the contact probe comprising a plurality of the contacting members as claimed in claim 1;

making the plurality of the contacting members for the contact probe mechanically and electrically contact a plurality of contact pads of an unpackaged semiconductor device; and testing the unpackaged semiconductor device via the at least one contact probe.

16. A tested semiconductor device, which has been tested by a testing process performed by at least one contact probe mechanically and electrically contacting the tested semiconductor device, the tested semiconductor device comprising a plurality of contact pads, the contact probe comprising a plurality of the contacting members as claimed in claim 1, the testing process being performed by the contact ends of the plurality of the contacting members for the contact probe contacting the contact pads.

17. A method of manufacturing a contacting member for a contact probe for performing a functionality test to a device under test, the method comprising the steps of:

providing a substrate made of a conductive material and comprising a relatively thinner region, at least one relatively thicker region, and at least one transition region extending from the relatively thinner region to the relatively thicker region in a way of gradually increasing in thickness, an upside of the substrate comprising a first surface located at the relatively thinner region, at least one second surface located at the at least one relatively thicker region, and at least one transition surface located at the at least one transition region, the second surface being higher than the first surface, the transition surface extending upwardly from the first surface to the second surface in a way of gradually changing in height; and defining a plurality of the contacting members of the contact probe by removing partial material of the substrate, the step of defining the plurality of the contacting members of the contact probe comprising defining a contact tip of each of the plurality of the contacting members of the contact probe in the relatively thicker region of the substrate, defining a body of each of the plurality of the contacting members of the contact probe in the relatively thinner region of the substrate, and performing a cutting process to the substrate in correspondence with a contour of the plurality of the contacting members of the contact probe.

18. The method of manufacturing the contacting member for the contact probe for performing the functionality test to the device under test as claimed in claim 17, wherein the method further comprises the step of:

sharping the contact tip of each of the plurality of the contacting members for the contact probe to provide each of the contact tips of each of the plurality of the contacting members for the contact probe a tip top surface, a tip bottom surface, and a contact end located at a juncture of the tip top surface and the tip bottom surface, the contact end being configured for contacting the device under test.

19. The method of manufacturing the contacting member for the contact probe for performing the functionality test to the device under test as claimed in claim 17, wherein the substrate comprises two said transition regions located on two opposite sides of the relatively thinner region respectively, and two said relatively thicker regions connected with the two transition regions respectively; the upside of the substrate comprises two said second surfaces located at the two relatively thicker regions respectively, and two said transition surfaces located at the two transition regions respectively; the step of defining the plurality of the contacting members for the contact probe comprises defining the contact tip of each of the plurality of the contacting members for the contact probe in one of the two relatively thicker regions, and defining the body of each of the plurality of the contacting members for the contact probe in the relatively thinner region and another of the two relatively thicker regions.

20. The method of manufacturing the contacting member for the contact probe for performing the functionality test to the device under test as claimed in claim 17, wherein the substrate is formed from a flat plate by a surface lowering process; the first surface and the at least one transition surface are produced by the surface lowering process so that surface roughness of the first surface and the at least one transition surface is different from surface roughness of the at least one second surface; the surface lowering process is performed prior to the step of defining the plurality of contacting members for the contact probe by removing the partial material of the substrate.

* * * * *